US012245395B2

(12) United States Patent
Abdouch et al.

(10) Patent No.: US 12,245,395 B2
(45) Date of Patent: Mar. 4, 2025

(54) TECHNIQUES FOR SMALL FORM FACTOR DEVICE COOLING

(71) Applicant: SIMPLY NUC, INC., Round Rock, TX (US)

(72) Inventors: Charles Abdouch, Round Rock, TX (US); Joseph Giannuzzi, Cedar Park, TX (US)

(73) Assignee: SIMPLY NUC, INC., Round Rock, TX (US)

(*) Notice: Subject to any disclaimer, the term of this patent is extended or adjusted under 35 U.S.C. 154(b) by 0 days.

(21) Appl. No.: 18/474,950

(22) Filed: Sep. 26, 2023

(65) Prior Publication Data

US 2024/0107701 A1    Mar. 28, 2024

Related U.S. Application Data

(60) Provisional application No. 63/410,020, filed on Sep. 26, 2022.

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01); *H05K 7/20154* (2013.01); *H05K 7/20172* (2013.01); *H05K 7/20209* (2013.01)

(58) Field of Classification Search
CPC ....... G06F 1/203; G06F 1/20; H05K 7/20145; H05K 7/20172; H05K 7/20154; H05K 7/20209; H05K 7/20163; F04D 25/0613; F04D 29/281; F04D 25/166; F04D 29/4226; F04D 25/08; H01L 23/467
See application file for complete search history.

(56) References Cited

U.S. PATENT DOCUMENTS

| | | | | |
|---|---|---|---|---|
| 5,953,209 A | * | 9/1999 | Chiu | H05K 7/20154 361/715 |
| 6,671,177 B1 | * | 12/2003 | Han | H01L 23/467 257/722 |
| 6,723,917 B1 | * | 4/2004 | Wang | H01L 23/467 361/720 |
| 6,795,315 B1 | * | 9/2004 | Wu | H01L 23/467 174/16.3 |
| 7,002,797 B1 | * | 2/2006 | Wittig | H05K 7/20154 174/16.3 |
| 7,382,616 B2 | * | 6/2008 | Stefanoski | H01L 23/467 361/698 |
| 11,599,163 B2 | * | 3/2023 | Grossmann | H05K 7/2039 |
| 2004/0095719 A1 | * | 5/2004 | Rong-Yao | G06F 1/20 361/679.48 |
| 2005/0061477 A1 | * | 3/2005 | Mira | H01L 23/467 257/E23.099 |
| 2007/0133178 A1 | * | 6/2007 | Han | H01L 23/427 257/E23.099 |

(Continued)

*Primary Examiner* — Michael A Matey
(74) *Attorney, Agent, or Firm* — Kunzler Bean & Adamson

(57) ABSTRACT

Apparatuses, systems, and methods are disclosed for techniques for small form factor device cooling. An apparatus includes a housing unit, a fan located within the housing unit, a plurality of inlets on the housing unit for directing air to the fan, and a plurality of exhaust ports on the housing unit for directing air away from the fan in multiple different directions.

18 Claims, 9 Drawing Sheets

(56) References Cited

U.S. PATENT DOCUMENTS

| | | | |
|---|---|---|---|
| 2008/0055853 A1* | 3/2008 | Lin | G06F 1/20 257/E23.099 |
| 2008/0158820 A1* | 7/2008 | Peng | H01L 23/427 165/122 |
| 2009/0147476 A1* | 6/2009 | Han | G06F 1/20 361/697 |
| 2009/0310296 A1* | 12/2009 | Peng | G06F 1/20 361/679.49 |
| 2011/0025987 A1* | 2/2011 | Furumi | G03B 21/16 353/121 |
| 2012/0300401 A1* | 11/2012 | Wu | H01L 23/467 361/697 |
| 2013/0114204 A1* | 5/2013 | Nigen | H01L 23/427 361/679.48 |
| 2017/0184863 A1* | 6/2017 | Balachandreswaran | G02B 27/0176 |
| 2019/0227605 A1* | 7/2019 | Wiltzius | H05K 7/20145 |
| 2020/0352051 A1* | 11/2020 | He | F04D 29/4246 |
| 2021/0153382 A1* | 5/2021 | Saroor | G06F 1/206 |
| 2021/0341976 A1* | 11/2021 | Helberg | H05K 7/20163 |
| 2022/0350381 A1* | 11/2022 | Pescetto | G05B 19/4155 |
| 2023/0171914 A1* | 6/2023 | Lin | H05K 7/2039 361/679.47 |
| 2023/0328923 A1* | 10/2023 | Lee | H05K 7/20263 |
| 2023/0328930 A1* | 10/2023 | Lin | G06F 1/20 361/697 |

* cited by examiner

TECHNIQUES FOR SMALL FORM FACTOR DEVICE COOLING

CROSS REFERENCE TO OTHER APPLICATIONS

This application claims the benefit of United States Provisional Patent Application No. 63/410,020 entitled "SMALL FORM FACTOR PC SPLIT EXHAUST PATH COOLING SOLUTION" and filed on Sep. 26, 2022, for Charles Abdouch, which is incorporated herein by reference.

FIELD

This invention relates to computing devices and more particularly relates to techniques for small form factor device cooling.

BACKGROUND

Modern computer system, in particular smaller form factor personal computers (PCs), other than laptops, have continued to push the limits of operational temperature ranges, (e.g., in excess of 45 watts) by incorporating higher performance CPUs, memory, and other features, e.g., SSD storage, SSD drives, etc. This, to ensure that they can meet the aggressive demands of the marketplace and generationally meet higher system Thermal Design Points (TDPs) that result from these denser, feature rich configurations.

BRIEF SUMMARY

An apparatus for small form factor device cooling, in one embodiment, includes a housing unit, a fan located within the housing unit, a plurality of inlets on the housing unit for directing air to the fan, and a plurality of exhaust ports on the housing unit for directing air away from the fan in multiple different directions.

In one embodiment, the apparatus includes at least one heat sink located on the housing unit, the at least one heat sink configured to engage and draw heat away from a component device.

In one embodiment, the fan comprises a plurality of blades, each blade configured with a predetermined geometry and pitch.

In one embodiment, the apparatus includes a plurality of folded metal sections located at an exit of each of the plurality of exhaust ports allowing for efficient exhaust of heated air.

In one embodiment, the fan is configured to rotate in clockwise and counterclockwise directions.

In one embodiment, the fan is configured to rotate at a predefined revolutions per minute corresponding to a temperature of a system where the apparatus is installed.

In one embodiment, the plurality of exhaust ports are configured and sized for a system where the apparatus is installed.

In one embodiment, the plurality of exhaust ports comprises two exhaust ports that are positioned relative to one another at a 90 degree angle.

In one embodiment, the apparatus is configured to be installed in a computing system that has an overall volume of less than one liter.

In one embodiment, an apparatus includes a carrier plate made of a thermally conductive material, a housing unit mounted to the carrier plate, a fan located within the housing unit, a plurality of inlets on the housing unit for directing air to the fan; and an exhaust port for directing air away from the fan. In one embodiment, the carrier plate is formed with at least one heat sink that is configured to engage and draw heat away from a component device via the fan.

In one embodiment, the at least one heat sink comprises at least one raised surface of the carrier plate that is shaped and sized to correspond to a shape and size of the component device.

In one embodiment, the fan comprises a plurality of blades, each blade configured with a predetermined geometry and pitch.

In one embodiment, the fan is configured to rotate in clockwise and counterclockwise directions.

In one embodiment, the fan is configured to rotate at a predefined revolutions per minute corresponding to a temperature of a system where the apparatus is installed.

In one embodiment, the carrier plate comprises an expansion port for connecting an additional component device to a system where the apparatus is installed.

In one embodiment, the apparatus is configured to be installed in a computing system that has an overall volume of less than one liter.

A computing system, in one embodiment, includes a first cooling device and a second cooling device. The first cooling device, in one embodiment, includes housing unit, a fan located within the housing unit, a plurality of inlets on the housing unit for directing air to the fan, and a plurality of exhaust ports on the housing unit for directing air away from the fan in multiple different directions. The second cooling device, in one embodiment, includes a carrier plate made of a thermally conductive material, a housing unit mounted to the carrier plate, a fan located within the housing unit, a plurality of inlets on the housing unit for directing air to the fan; and an exhaust port for directing air away from the fan. In one embodiment, the carrier plate is formed with at least one heat sink that is configured to engage and draw heat away from a component device via the fan.

In one embodiment, the computing system includes at least one temperature sensor for detecting a temperature of the system, an area of the system, a component of the system, or a combination thereof.

In one embodiment, the computing system includes at least one controller for controlling at least one setting of the first cooling device, the second cooling device, or a combination thereof, the at least one setting determined based on the temperature that the at least one temperature sensor detects.

In one embodiment, the at least one setting comprises a rotational speed or a rotational direction of the first fan or the second fan.

In one embodiment, the computing system comprises a small form factor having an overall volume of less than one liter.

BRIEF DESCRIPTION OF THE DRAWINGS

In order that the advantages of the embodiments of the subject disclosure will be readily understood, a more particular description of the embodiments will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
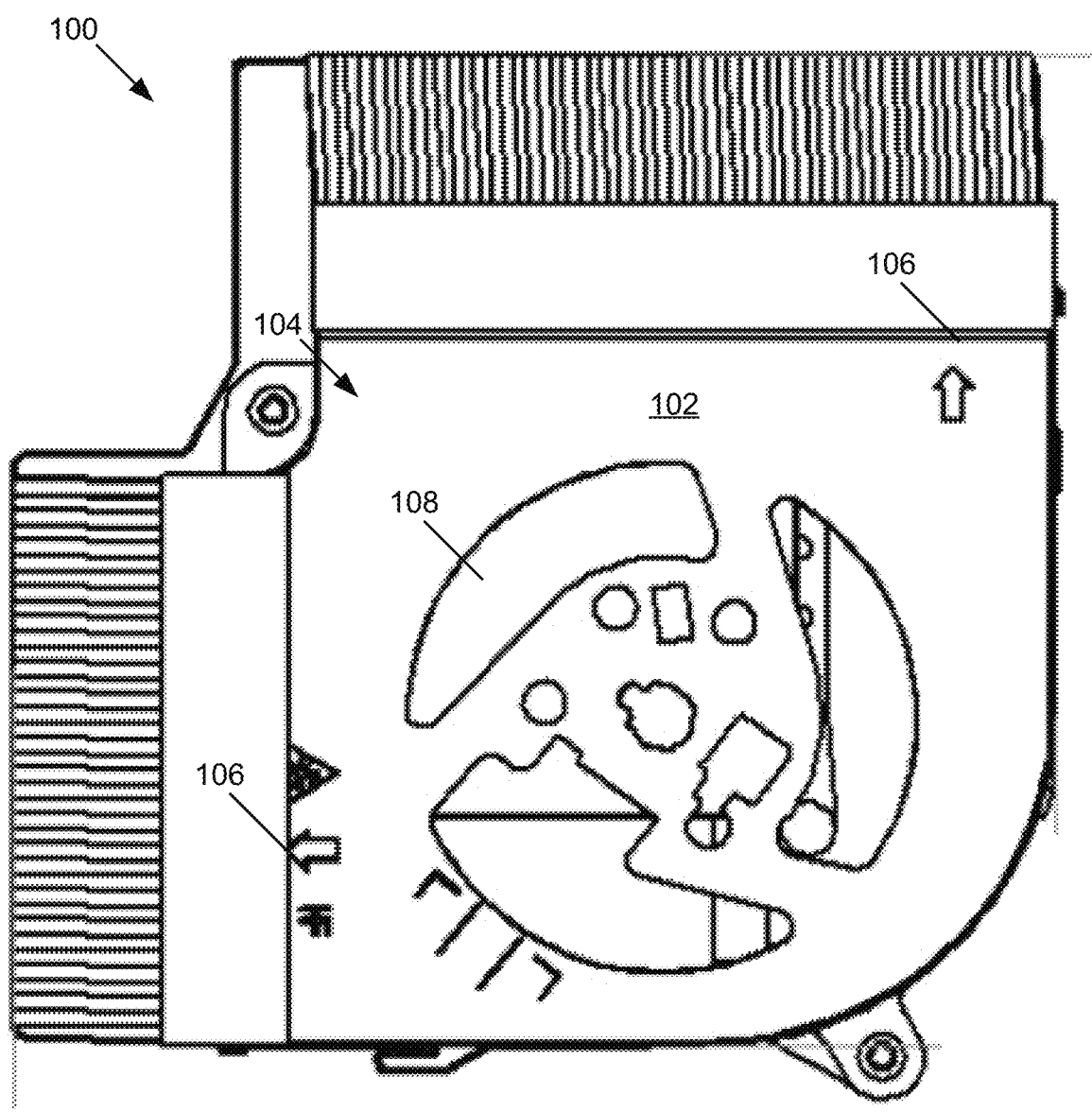
FIG. 1 depicts a Split Exhaust Cooler Overhead 2D View/Unmounted, according to examples of the subject disclosure.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

The description of elements in each figure may refer to elements of proceeding figures Like numbers refer to like elements in all figures, including alternate embodiments of like elements.

Modern computer system, in particular smaller form factor PCs, other than laptops, have continued to push the limits of operational temperature ranges, (e.g., in excess of 45 watts) by incorporating higher performance CPUs, memory, and other features, e.g., SSD storage, SSD drives, etc. This, to ensure that they can meet the aggressive demands of the marketplace and generationally meet higher system TDPs, (Thermal Design Points) that result from these denser, feature rich configurations.

One way to meets these generational demands is to innovate and derive concepts, specifically cooling solutions that enable and advance the overall design point of small form factor PCs.

New, unique, differentiated, and advanced cooling solutions are required to meet high-end computing demands. The concept and idea detailed herein addresses these needs by providing such a solution.

As used herein, a small form factor PC is a computer that has a size of up to one liter. Due to the small form factor, several technical challenges arise such as providing an appropriate amount of air flow to cool the system, e.g., in Linear Feet Per Minute (LFM), and exhausting the heated air efficiently, while keeping the noise that the cooling solution produces below a threshold level over a range of operational temperatures associated with different performance settings. The performance settings may be subdivided into predefined categories, for example:

Low setting, or what may be referred to as "Quiet Mode": This is when the fan/blower of the cooling solution is running at its lowest speed/revolutions per minute (RPM);

Medium setting, or what may be referred to as "Balanced Mode": This is when the fan/blower of the cooling solution is running at a mid-level speed/RPM;

High setting, or what may be referred to as "Performance Mode": This is when the fan/blower is running at a higher level, but not at its maximum speed/RPM; and Ultra-High setting, or what may be referred to as "Ultra Performance Mode": A differentiated setting not conventionally employed in small form factor PCs due to the sound level that the typical fan blade arrangement produces. However, the solution proposed herein may perform as a fan or blower and is based on an optimized blade geometry and pitch. In one embodiment described below, the fan blades spin at their highest possible speed, which may be limited by the available current/power and the motor's design limits.

Small form factor PC systems typically only use one fan/blower, which limits the ability to cool the system and limits the effectiveness of the TDP. A unique and differentiated cooling solution described herein is designed appropriately for small form factor PC systems can allow for higher overall TDPs to be achieved, keeping all core electronics at a more idealized runtime temperature (within some level of margin).

In one embodiment, the cooling solution described herein allows for a higher overall system TDP, in a small form factor PC of a volume of less than one liter, up to but not limited to 45 watts, to be realized while still allowing for additional runtime thermal margin.

FIG. 1 depicts an overhead view of one embodiment of a top surface of a housing unit 102 of a split exhaust cooling device 100 described herein. In the depicted embodiment, the split exhaust cooling device 100 is free standing and is not attached to a printed circuit board (PCB) of a computing system. FIG. 1 shows the fan/blower section 104, with specially configured vent openings/inlets 108 in the housing unit 102 to allow air to flow in from the top surface, which is then pulled into the center of the cooling solution (where the fan/blower is located) and vented out through two exhaust ports 106 of the housing unit 102. In one embodiment, the exhaust ports 106 direct air in different directions away from the fan/blower and the small form factor PC.

The dual exhaust port design, which is not limited to two exhaust ports, but could include more than two, improves the efficiency of a small form factor PC by moving more heated air out and away from the small form factor PC. Moreover, the claimed solution herein reduces static convection areas within the small form factor PC and provides greater air throughput through the small form factor PC.

Moreover, at lower speeds, the split exhaust cooling device 100 acts as a fan versus a blower. As a fan, the split exhaust cooling device 100 has a statis pressure that is equal at both an inlet and an outlet. As a blower, the static pressure is higher at the output than at the input. The split exhaust cooling device 100 can act as both a fan and a blower depending on the performance needs of the small form factor PC, which may be dynamically determined according to a temperature of the small form factor PC, a system setting, and/or the like.

Figure 2:
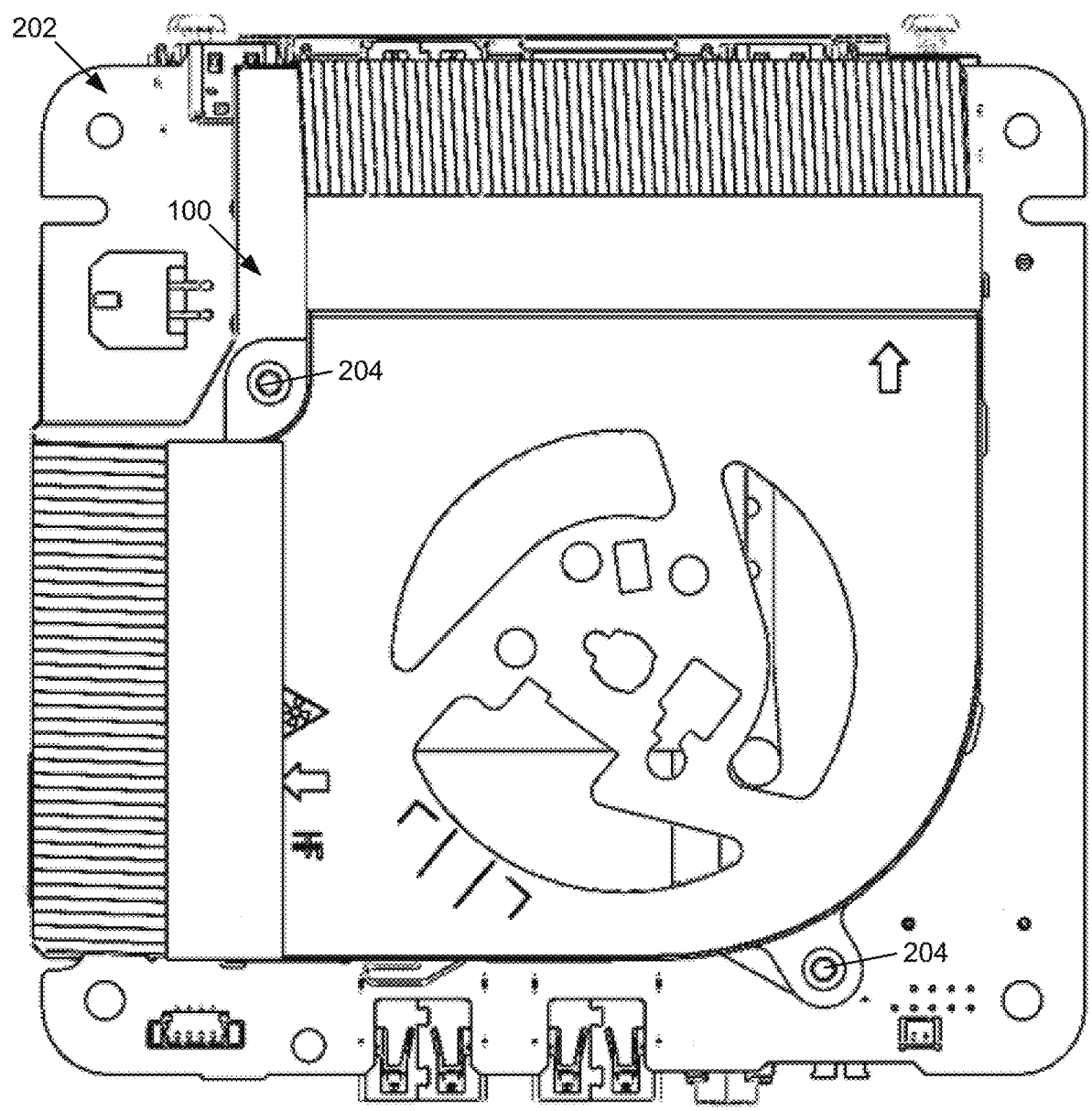
FIG. 2 depicts a Split Exhaust Cooler sub-assembly Top 2D View/Mounted To a PCB, according to examples of the subject disclosure.

FIG. 2 depicts one embodiment of an overhead view of the split exhaust cooling device 100, as described in FIG. 1, detailed above. In the depicted embodiment, the split exhaust cooling device 100 is shown attached to a PCB 202 of a computing system, e.g., the main PCB of the small form factor PC, via two mounting screw holes 204.

Figure 3:
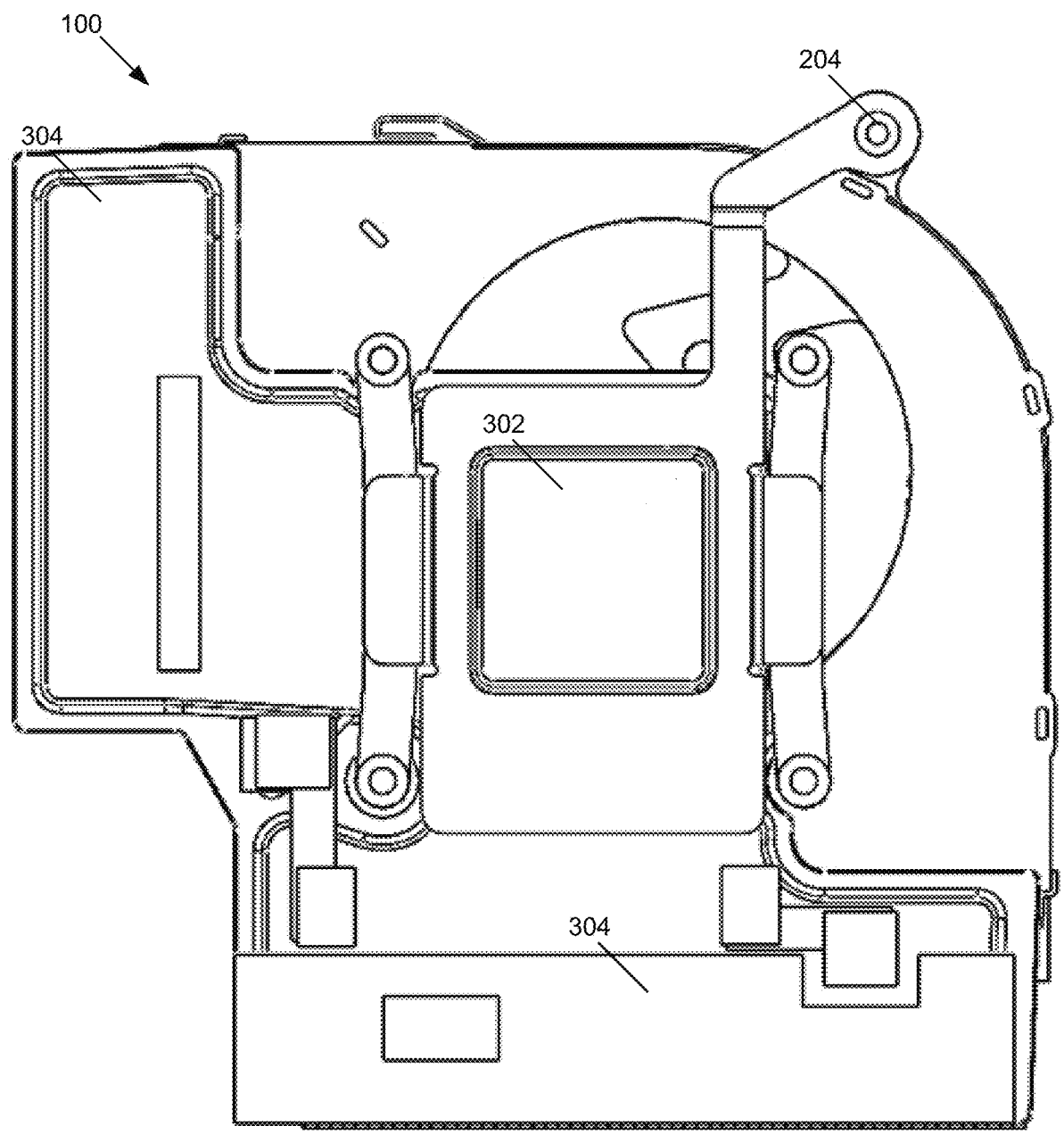
FIG. 3 depicts a Split Exhaust Cooler sub-assembly Bottom 2D View with Thermal Plate & Heat Spreaders, in accordance with examples of the subject disclosure.

FIG. 3 depicts one embodiment of a view of the bottom of the split exhaust cooling device 100, freestanding and not mounted to a PCB. The depicted embodiment shows the cooling plate section 302, the mounting screw hole positions 204, and an area comprising heat spreaders and vapor chambers 304, of which there are two in the depicted embodiment. In such an embodiment, the heat spreader absorbs heat from computing components, e.g., a memory device, and the vapor chamber circulates and spreads the heat, e.g., towards the fan/blower, to be blown out of the small form factor PC. The cooling plate 302 may be embodied as a heat sink or other thermal absorption device.

Figure 4:
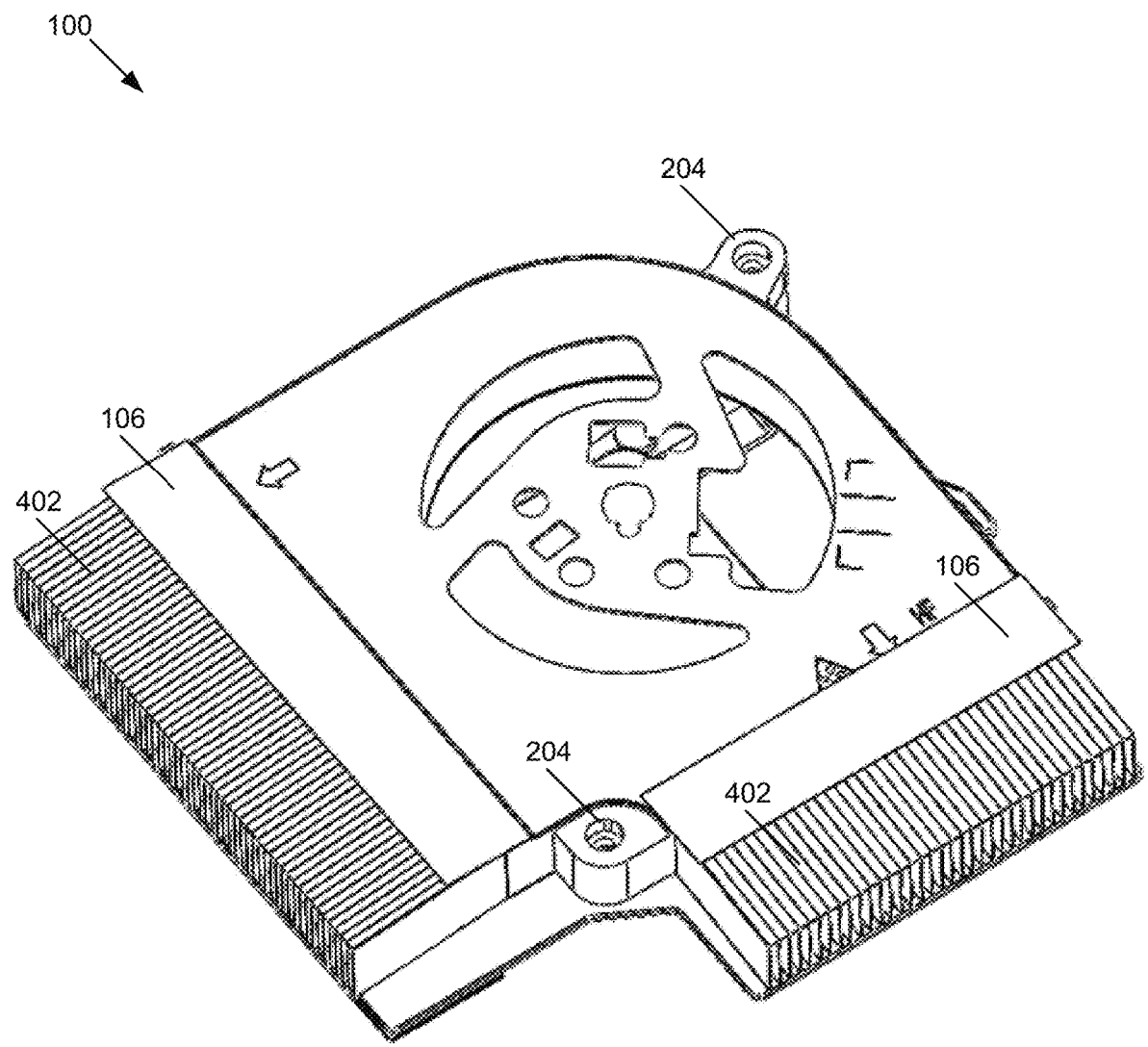
FIG. 4 depicts a Split Exhaust Cooler Sub-Assembly Overhead/Isometric View, according to examples of the subject disclosure.

FIG. 4 depicts an overhead, isometric view of one embodiment of the split exhaust cooling device 100. The depicted embodiment shows the exhaust ports 106 and aspects of the folded metal sections 402 of each exhaust port 106. In one embodiment, the folded metal sections 402 comprise copper surfaces that take heat away from the small form factor PC. The fan/blower blows heated air across the folded metal sections 402, where it is absorbed for heat dissipation and to prevent heated air from returning to the chassis. The depicted embodiment also shows the two main screw holes 204 that attach to the PCB.

In one embodiment, the exhaust ports 106 are mechanically tuned so that air cannot return into the small form factor PC chassis. In such an embodiment, the fan/blower is installed such that heated air is blown out of the small form factor PC and is prevented from reentering the chassis.

Figure 5:
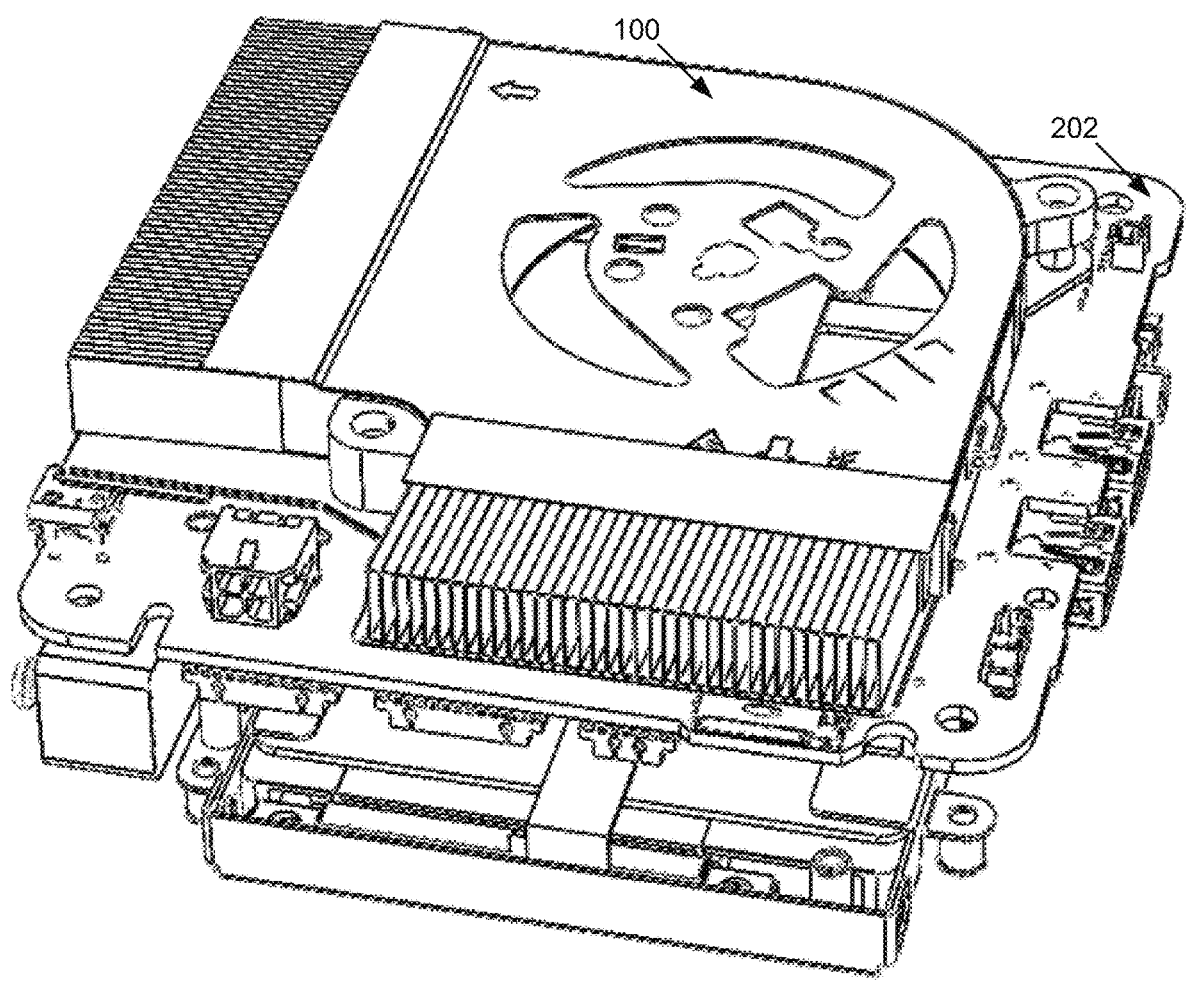
FIG. 5 depicts a Split Exhaust Cooler Mounted/Isometric View, according to examples of the subject disclosure.

FIG. 5 depicts an overhead, isometric view of the split exhaust cooling device 100 mounted to a PCB 202, e.g., a main PCB of a small form factor PC. FIG. 5 also shows one embodiment of the orientation of the split cooling device 100 relative to the PCB 202 with regard to front and rear input/output (I/O).

Figure 6:
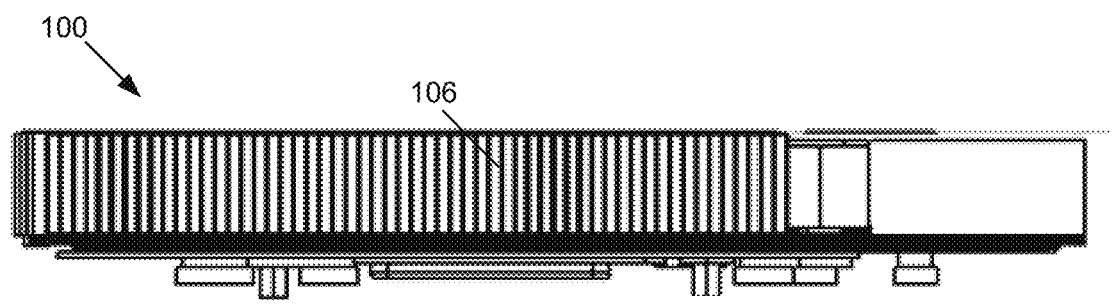
FIG. 6 depicts a Split Exhaust Cooler Side View/Exhaust (Dimensioned), according to examples of the subject disclosure.

FIG. 6 depicts a view from one side of the split exhaust cooler device 100, which highlights one embodiment of a larger of the two exhaust ports 106.

Figure 7:
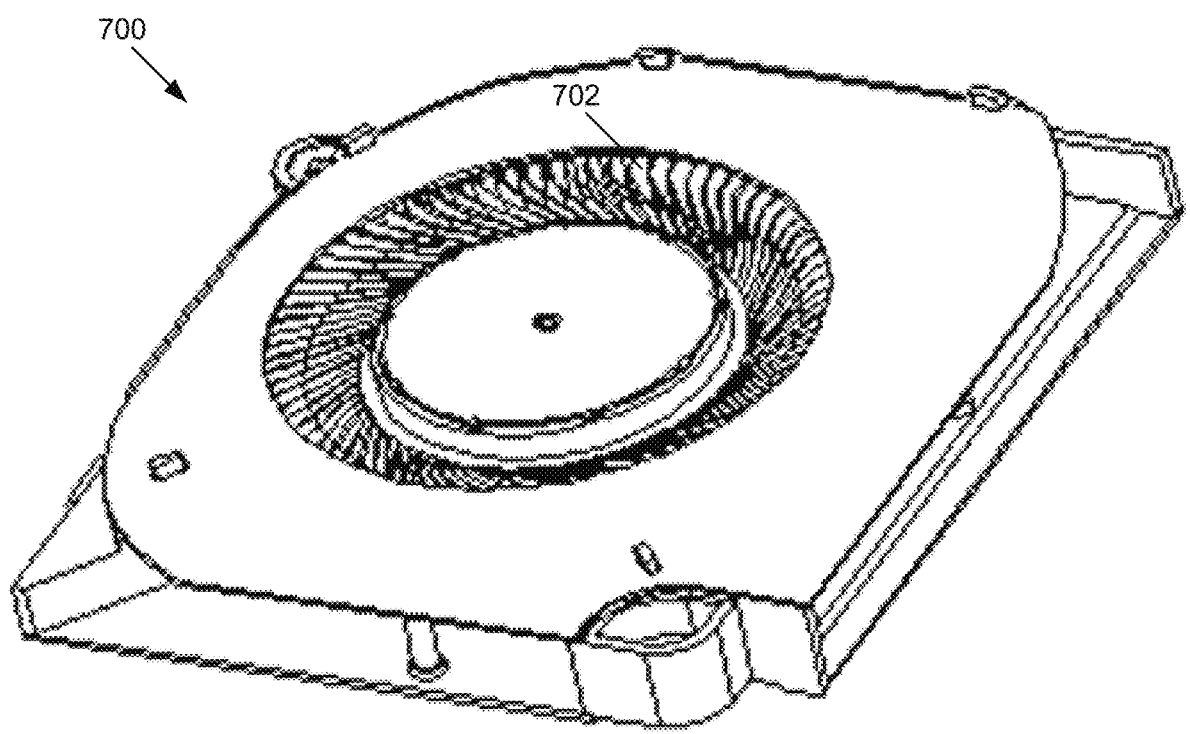
FIG. 7 depicts a Split Exhaust Cooler Fan/Blower Blades with Optimal Pitch & Geometry/Isometric View, according to examples of the subject disclosure.

FIG. 7 depicts an overhead, isometric view of the split exhaust cooler fan/blower blade sub-assembly 700, which is installed within the housing unit 102. The depicted embodiment shows the unique fan/blower blade geometry and pitch 702, which allows for a quieter runtime sound level. The fan/blower blades, for instance, may have a pitch that is greater than 45 degrees to push air away from the chassis. The pitch may be optimized based on the size, configuration, and/or the like of the small form factor PC, e.g., optimized to move an optimal amount of heated air out of the small form factor PC based on the performance needs of the system. Moreover, the number of fan/blower blades may be optimized for the size and configuration of the small form factor PC.

In one embodiment, the split exhaust cooling device 100 may include and/or be coupled to a controller, or other electronic control circuit, that controls various settings of the split exhaust cooling device 100, such as the rotational fan speed, the fan direction, and/or the like. In certain embodiments, the fan/blower is configured to rotate in clockwise and counterclockwise directions.

In certain embodiments, the split exhaust cooling device 100 may include and/or be coupled to one or more programmable temperature sensors. The temperature sensors may detect and output the temperature of the small form factor PC, or various components of the small form factor PC, which the split exhaust cooling device 100, or the controller, uses to trigger different actions related to the cooling of the small form factor PC.

For instance, if the temperature within the small form factor PC housing satisfies a threshold temperature, based on input from one or more temperature sensors configured to monitor the temperature of the small form factor PC housing, the controller may activate the fan/blower, at a predetermined speed corresponding with the monitored temperature (or temperature range), to exhaust heated air from the small form factor PC. Other thermal events may include detecting when the temperature of a PC component, such as the processor, memory, or storage device, or a combination of the foregoing, satisfies a predetermined temperature.

In certain embodiments, the controller may be in communication with an operating system, basis input/output system (BIOS), or firmware of the small form factor PC, which may transmit signals to the controller for configuring, activating, deactivating, or the like the split exhaust cooling device 100.

Figure 8A:
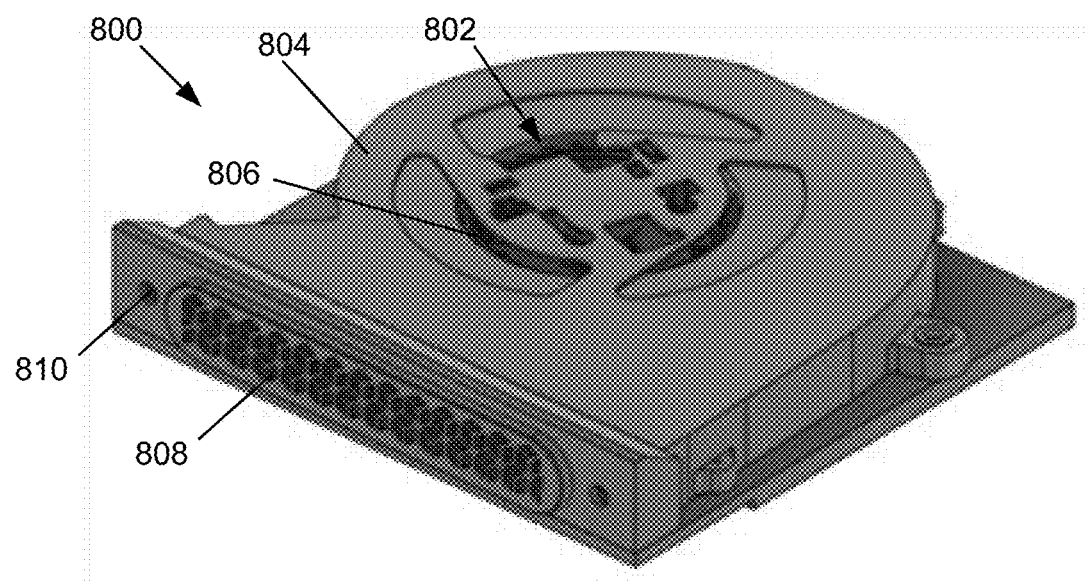
FIG. 8A depicts an isometric top side view of an optional performance cooler, according to examples of the subject disclosure.

FIG. 8A depicts one embodiment of a top view of an optional performance cooler (OPC) 800. The OPC 800, as referred to herein, is a modular component that can be installed in a small form factor PC for adding additional cooling to the small form factor PC. For example, the OPC 800 may be installed in an expansion port or may otherwise be mounted to a PBC, via one or more mounting points 810 (here, openings for screws or other mounting mechanisms).

In one embodiment, the OPC 800 includes a fan 802 within a housing 804. The housing 804 may include one or more vents or openings 806 for pulling in (hot) air from within the small form factor PC and exhausting or blowing the air through an exhaust port 808 pointed towards an exterior of the small form factor PC. The fan 802, in one embodiment, comprises a plurality of blades that are configured with a pitch and geometry that is optimized for moving heat out of the small form factor PC, similar to the split exhaust cooling device 100 described above.

Figure 8B:
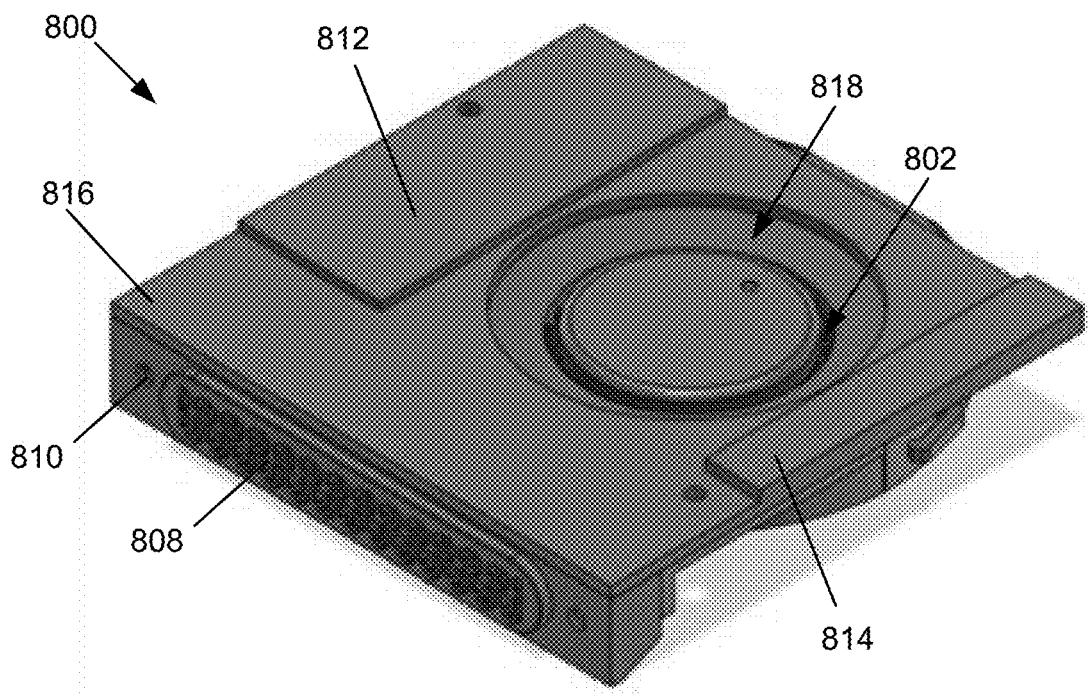
FIG. 8B depicts an isometric bottom side view of an optional performance cooler, according to examples of the subject disclosure.

FIG. 8B depicts one embodiment of a bottom view of an OPC 800. In the depicted embodiment, the OPC 800 includes a carrier plate 816 that the housing 804 and OPC fan 802 are coupled to. In one embodiment, the carrier plate 816 is mechanically mounted to the small form factor PC by one or more screws. The carrier plate 816, in certain embodiments, protrudes inward from an option bay opening and occupies a space below a bottom side of a PCB, where components such as memory and storage devices are connected to the PCB.

The carrier plate 816, in one embodiment, is made of a thermally conductive material, e.g., metal, and includes one or more protruding, raised, or elevated portions 812, 814 that are configured to contact or otherwise engage corresponding components of the small form factor PC, such as a memory device, a storage device, a processor, and/or the like device that has a temperature that contributes to an overall system TDP of the small form factor PC. In such an embodiment, the elevated portions 812, 814 act as heat sinks to absorb heat from the computing components that engage the elevated portions 812, 814. The absorbed heat may then be exhausted from the small form factor PC through the exhaust port 808.

In one embodiment, the carrier plate 816 may include an opening 818 to allow air flow through the carrier plate 816 and into the fan 802, to be pushed out of the small form factor PC through the exhaust port 808.

In one embodiment, the OPC 800 may include and/or be coupled to a controller, or other electronic control circuit, that controls various settings of the OPC 800, such as the rotational fan speed, the fan direction, and/or the like. In certain embodiments, the fan 802 is configured to rotate in clockwise and counterclockwise directions In certain embodiments, the OPC 800 may include and/or be coupled to one or more programmable temperature sensors. The temperature sensors may detect and output the temperature of the small form factor PC, or various components of the small form factor PC, which the OPC 800, or the OPC controller, uses to trigger different actions related to the cooling of the small form factor PC.

For instance, if the temperature within the small form factor PC housing satisfies a threshold temperature, based on input from one or more temperature sensors configured to monitor the temperature of the small form factor PC housing, the OPC controller may activate the OPC fan 802, at a predetermined speed corresponding with the monitored temperature (or temperature range), to exhaust heated air from the small form factor PC. Other thermal events may include detecting when the temperature of a PC component, such as the processor, memory, or storage device, or a combination of the foregoing, satisfies a predetermined temperature.

In certain embodiments, the OPC controller may be in communication with an operating system, basis input/output system (BIOS), or firmware of the small form factor PC, which may transmit signals to the OPC controller for configuring, activating, deactivating, or the like the OPC fan 802.

In one embodiment, the OPC 800 may include an expansion slot for a PC component such as an M.2 storage device, on the housing 804, on the carrier 816, and/or the like, which can be used to add an additional component to the small form factor PC system. For example, the carrier 816 may include an M.2 based expansion card port or slot for various form factors (sizes/lengths), e.g., 2242, 2280, or the like.

In one embodiment, the OPC 800 is used together with the split exhaust cooling device 100 such that a controller is configured to receive temperature data, monitor temperatures within the small form factor PC, and activate the split exhaust cooling device 100 and/or the OPC 800 for efficient heat transfer out of the small form factor PC. For instance, when the temperature data indicates that the temperature satisfies or exceeds predetermined temperature thresholds, the controller may activate the split exhaust cooling device 100 and/or the OPD 800. In this manner, the small form factor PC can run within the "Ultra-High" setting, e.g., Ultra Performance Mode, without overheating and shutting down.

In one embodiment, the aforementioned components represent a unique assemblage of components tuned to more effectively move heated air out of a small form factor PC.

Figure 9:
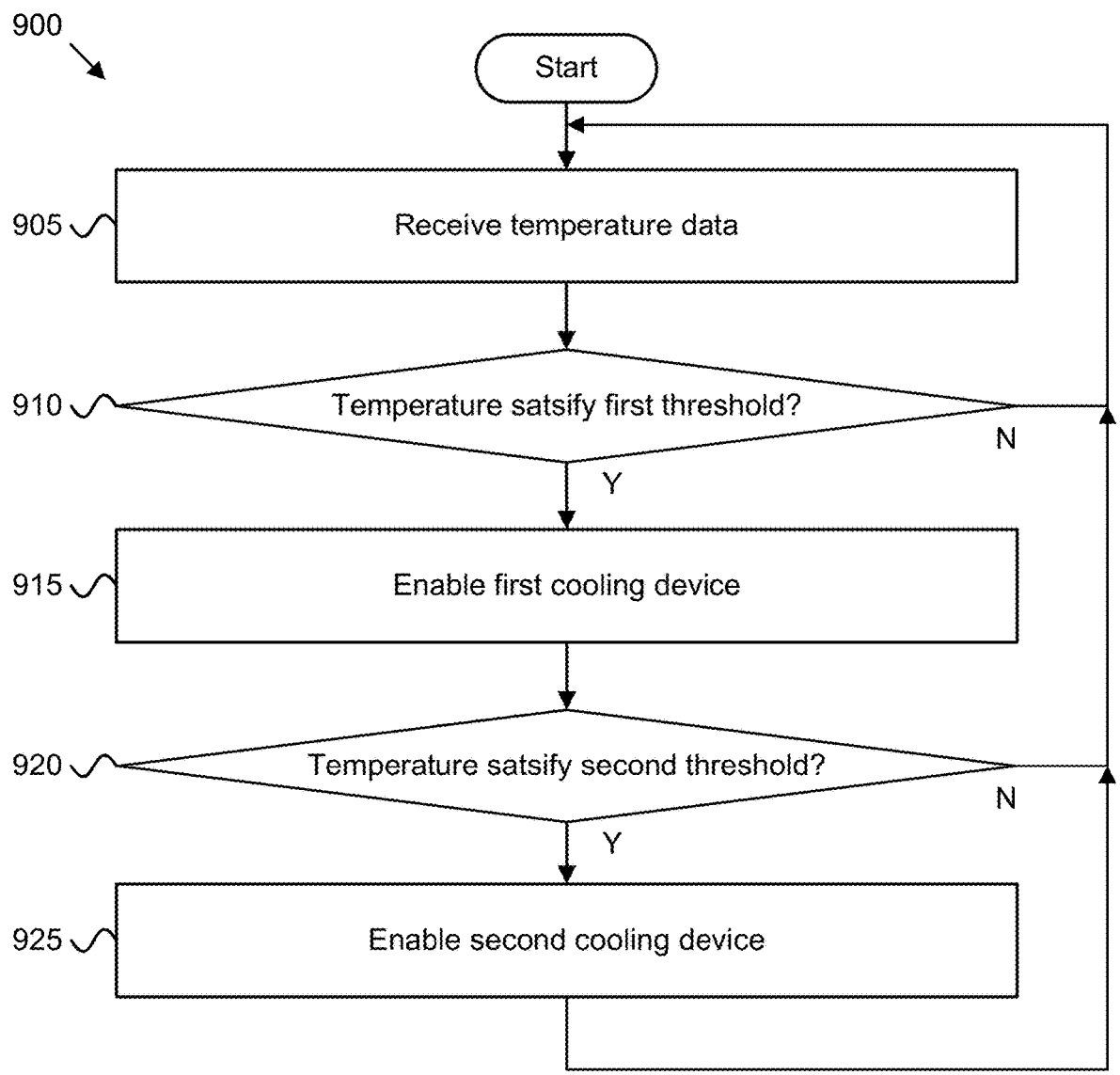
FIG. 9 depicts a schematic flowchart diagram of a method according to examples of the subject disclosure.
Figure 10A:
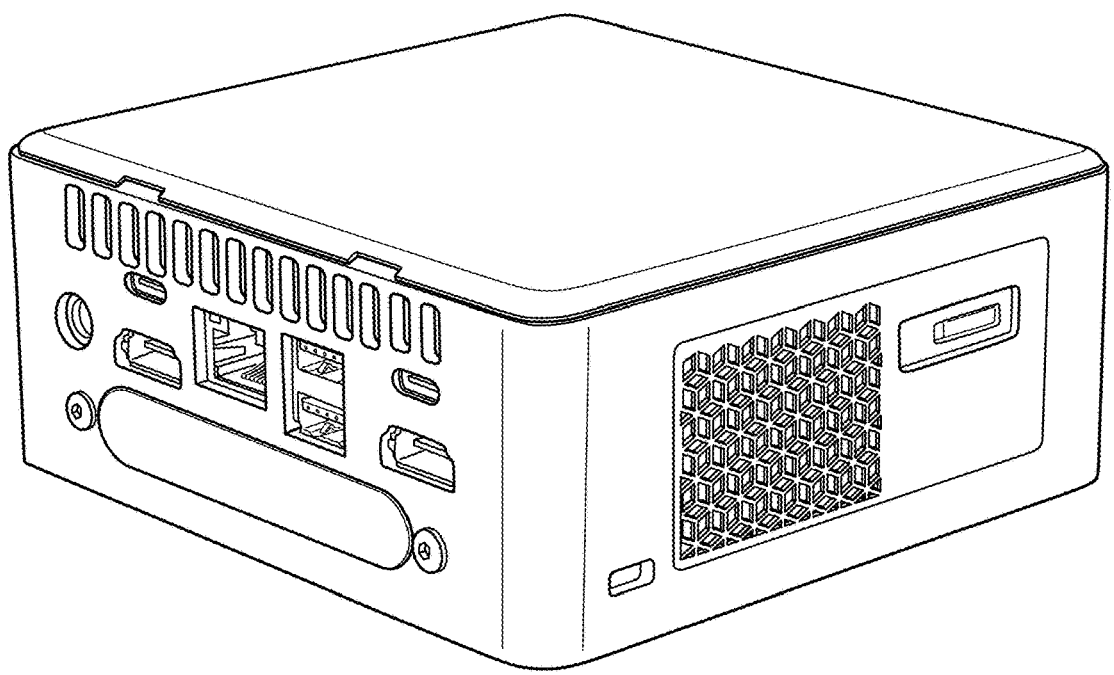
FIG. 10A depicts a perspective view of a small form factor PC with an expansion port for an optional performance cooler, according to examples of the subject disclosure.
Figure 10B:
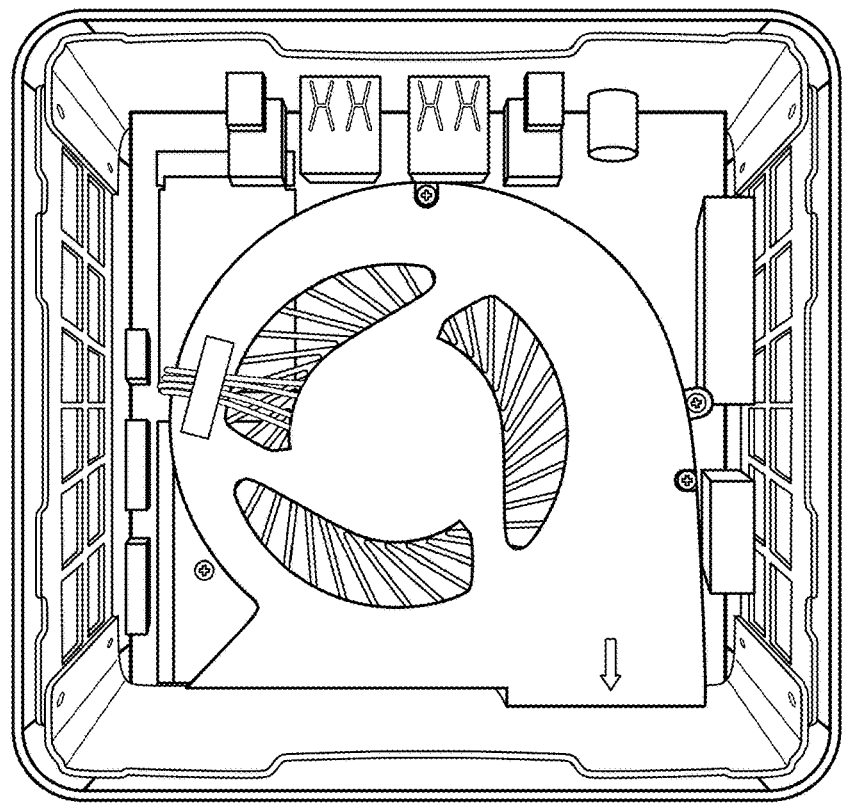
FIG. 10B depicts a top view of an inside of a small form factor PC that includes an optional performance cooler, according to examples of the subject disclosure.

FIG. 9 depicts one embodiment of a method 900 for techniques for small form factor device cooling. In one embodiment, the method 900 begins and receives 905 temperature data, e.g., from one or more temperature sensors within a small form factor PC. In one embodiment, if the method 900 determines 910 that the temperature satisfies a first threshold, the method 900 enables 915 a first cooling device, e.g., a cooling device with a split- or dual-exhaust configuration described above. Otherwise, the method 900 continues to receive 905 temperature data.

In one embodiment, if the method 900 determines 920 that the temperature satisfies a second threshold, the method 900 (or a user) enables 925 a second cooling device, e.g., an OPC cooling device described above. Otherwise, the method 900 continues to receive 905 temperature data.

This description uses examples to describe embodiments of the disclosure and also to enable any person skilled in the art to practice the embodiments, including making and using any devices or systems and performing any incorporated methods. The patentable scope of the disclosure is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus, comprising:
a carrier plate;
a housing unit mounted to the carrier plate;
a fan located within the housing unit; a plurality of inlets on the housing unit for directing air to the fan; and an exhaust port for directing air away from the fan,
wherein the carrier plate is formed of a thermally-conductive material configured to contact and draw heat away from a component device via the fan, the carrier plate comprising a protrusion that has a shape and size that corresponds to a shape and size of a surface of the component device and is located below the fan and adjacent to an opening that allows air flow through the carrier plate and into the fan, wherein the apparatus is configured to be installed in an expansion port of a computing device, and
wherein the carrier plate comprises a second expansion port for connecting an additional component device to the computing device.

2. The apparatus of claim 1, wherein the fan comprises a plurality of blades, each blade configured with a predetermined geometry and pitch.

3. The apparatus of claim 1, wherein the fan is configured to rotate in clockwise and counterclockwise directions.

4. The apparatus of claim 1, wherein the fan is configured to rotate at a predefined revolutions per minute corresponding to a temperature of a system where the apparatus is installed.

5. The apparatus of claim 1, wherein the apparatus is configured to be installed in a computing system that has an overall volume of less than one liter.

6. A computing system, comprising:
at least one temperature sensor, the at least one temperature sensor configured to sense a temperature associated with the computing system;
at least one expansion port;
a first cooling device, comprising:
 a first housing unit;
 a first fan located within the first housing unit;
 a first plurality of inlets on the first housing unit for directing air to the first fan; and
 a first plurality of exhaust ports on the first housing unit for directing air away from the first fan in multiple different directions; and
a second cooling device installed in the at least one expansion port, comprising:
 a carrier plate;
 a second housing unit mounted to the carrier plate;
 a second fan located within the second housing unit;
 a second plurality of inlets on the second housing unit for directing air to the second fan; and
 a second exhaust port for directing air away from the second fan,
wherein the carrier plate is formed of a thermally conductive material and at least one heat sink that is configured to engage and draw heat away from a component device via the second fan, the at least one heat sink comprising a protrusion that has a shape and size that corresponds to a shape and size of a surface of the component device that contacts the at least one heat sink and is located below the second fan and adjacent to an opening that allows air flow through the carrier plate and into the second fan,
wherein the first cooling device is activated in response to the temperature associated with the computing system satisfying a first threshold temperature and the second cooling device is activated in response to the temperature associated with the computing system satisfying a second threshold temperature.

7. The computing system of claim 6, wherein the at least one temperature sensor detects a temperature of the system, an area of the system, a component of the system, or a combination thereof.

8. The computing system of claim 7, further comprising at least one controller for controlling at least one setting of the first cooling device, the second cooling device, or a combination thereof, the at least one setting determined based on the temperature that the at least one temperature sensor detects.

9. The computing system of claim 8, wherein the at least one setting comprises a rotational speed or a rotational direction of the first fan or the second fan.

10. The computing system of claim 6, wherein the computing system comprises a small form factor having an overall volume of less than one liter.

11. The computing system of claim 6, wherein the first fan comprises a plurality of blades, each blade configured with a predetermined geometry and pitch.

12. The computing system of claim 6, wherein the first cooling device comprises a plurality of folded metal sections located at an exit of each of the plurality of exhaust ports allowing for efficient exhaust of heated air.

13. The computing system of claim 6, wherein the first fan is configured to rotate in clockwise and counterclockwise directions.

14. The computing system of claim 6, wherein the first fan is configured to rotate at a predefined revolutions per minute based on a temperature of the computing system.

15. The computing system of claim 7, wherein the first plurality of exhaust ports is configured and sized for the computing system.

16. The computing system of claim 6, wherein the first plurality of exhaust ports comprises two exhaust ports that are positioned relative to one another at a 90-degree angle.

17. The computing system of claim 6, wherein the carrier plate comprises a second expansion port for connecting an additional component device to the computing system.

18. The computing system of claim 17, wherein the second expansion port comprises an expansion card port for an M.2 storage device.

* * * * *